(12) United States Patent
Wilkas

(10) Patent No.: US 12,191,187 B2
(45) Date of Patent: Jan. 7, 2025

(54) DUAL ARM WITH OPPOSED DUAL END EFFECTORS AND NO VERTICAL WAFER OVERLAP

(71) Applicant: Persimmon Technologies Corporation, Wakefield, MA (US)

(72) Inventor: Scott Wilkas, Lexington, MA (US)

(73) Assignee: PERSIMMON TECHNOLOGIES CORPORATION, Wakefield, MA (US)

( * ) Notice: Subject to any disclaimer, the term of this patent is extended or adjusted under 35 U.S.C. 154(b) by 914 days.

(21) Appl. No.: 17/071,486

(22) Filed: Oct. 15, 2020

(65) Prior Publication Data

US 2021/0118719 A1    Apr. 22, 2021

Related U.S. Application Data

(60) Provisional application No. 62/915,884, filed on Oct. 16, 2019.

(51) Int. Cl.
| | | |
|---|---|---|
| *H01L 21/687* | (2006.01) | |
| *B25J 9/04* | (2006.01) | |
| *B25J 11/00* | (2006.01) | |
| *B25J 15/00* | (2006.01) | |

(52) U.S. Cl.
CPC ........ *H01L 21/68707* (2013.01); *B25J 9/043* (2013.01); *B25J 11/0095* (2013.01); *B25J 15/0052* (2013.01)

(58) Field of Classification Search
CPC ................ H01L 21/68707; B25J 9/043; B25J 11/0095; B25J 15/0052
See application file for complete search history.

(56) References Cited

U.S. PATENT DOCUMENTS

| 9,149,936 B2 | 10/2015 | Hosek et al. | |
|---|---|---|---|
| 2016/0167229 A1* | 6/2016 | Hosek ...................... | B25J 18/04 |
| | | | 74/490.06 |
| 2017/0368680 A1* | 12/2017 | Muthukamatchi .......................... | |
| | | | H01L 21/67184 |

* cited by examiner

*Primary Examiner* — Jaime Figueroa
*Assistant Examiner* — Jamal A Shah
(74) *Attorney, Agent, or Firm* — McCarter & English LLP

(57) ABSTRACT

An apparatus including a drive; and a movable arm assembly connected to the drive. The movable arm assembly includes a first arm and a second arm, where the first arm includes a first upper arm, a first forearm and a first end effector, and where the second arm includes a second upper arm, a second forearm and a second end effector. The first end effector includes at least two first substrate holding areas. The second end effector includes at least two second substrate holding areas. The drive and the movable arm assembly are configured to prevent the movable arm assembly from passing over top sides of substrates located on the first and second substrate holding areas.

20 Claims, 10 Drawing Sheets

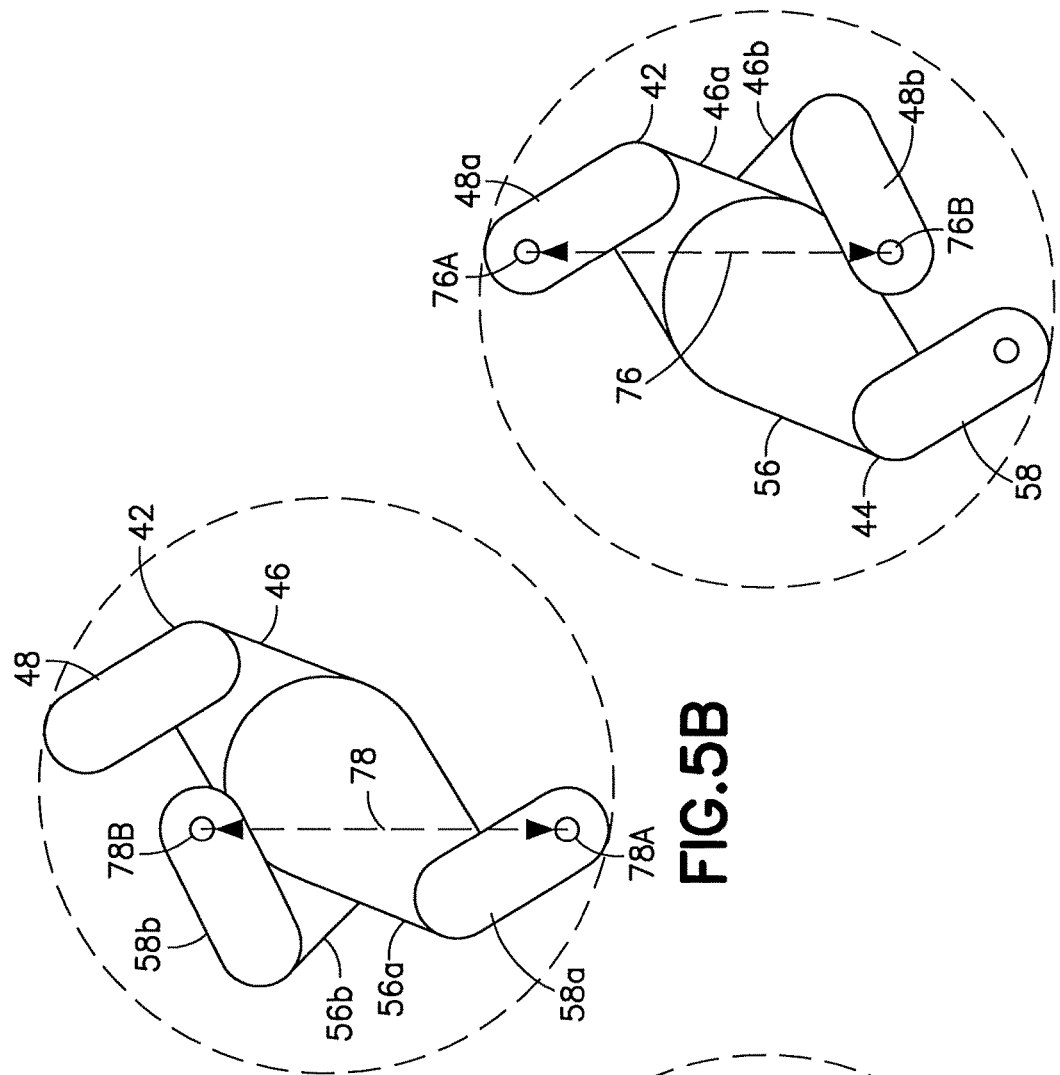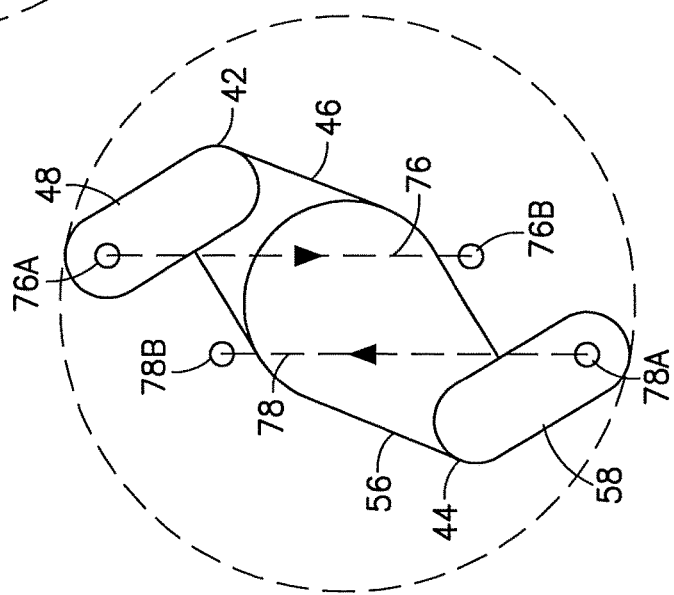

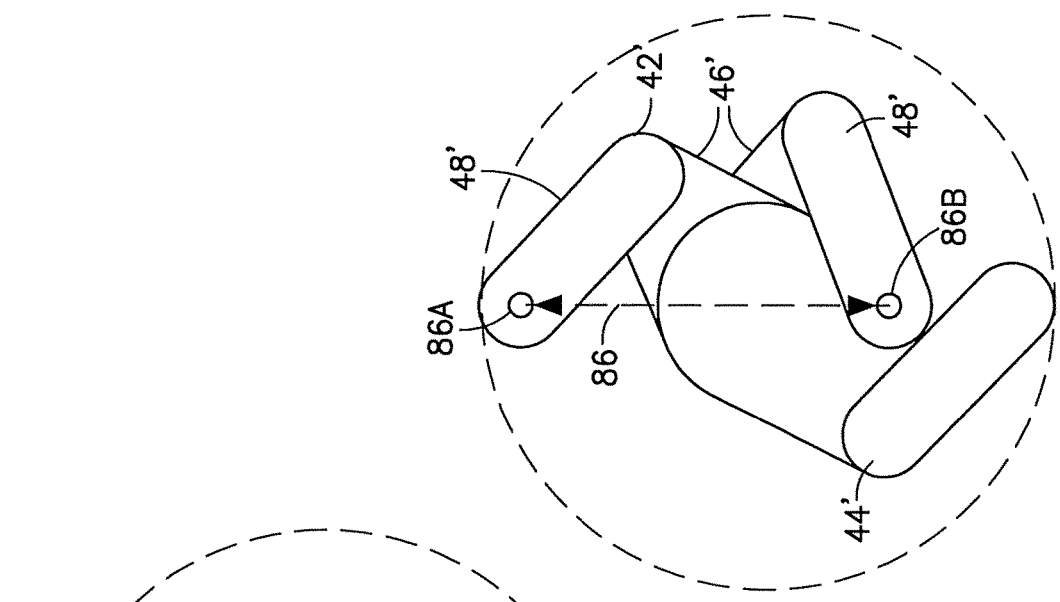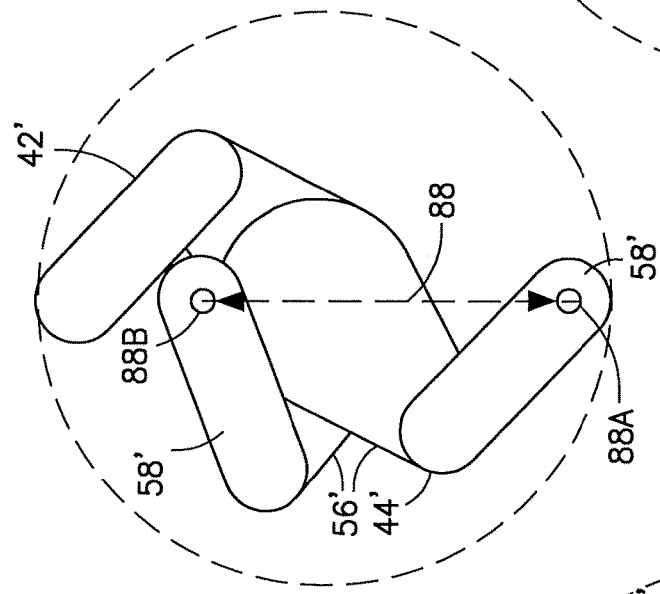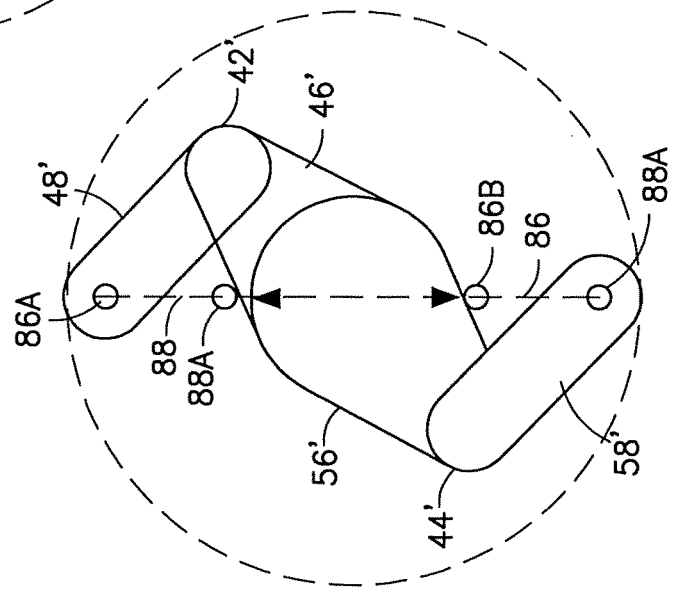

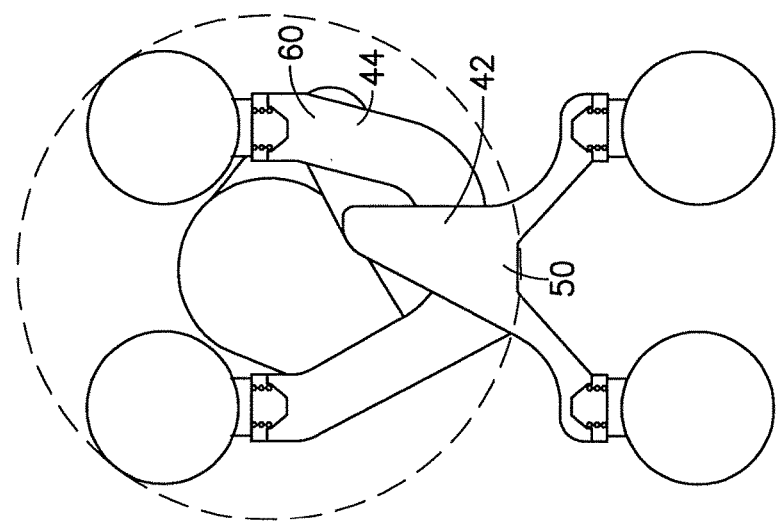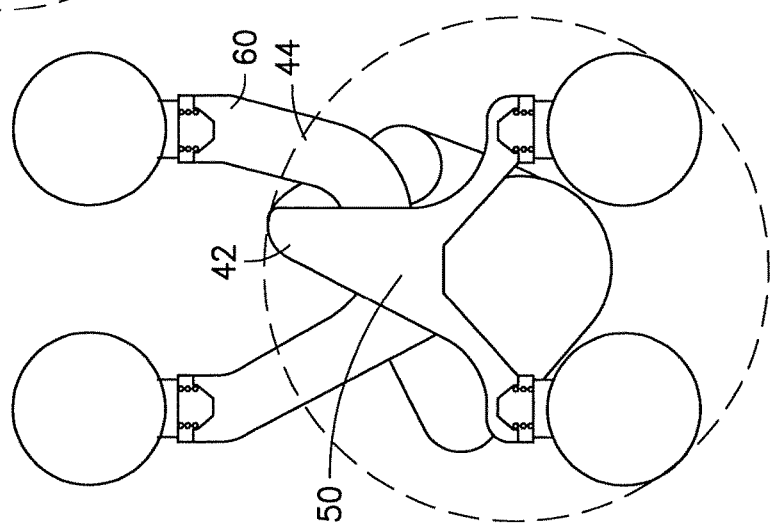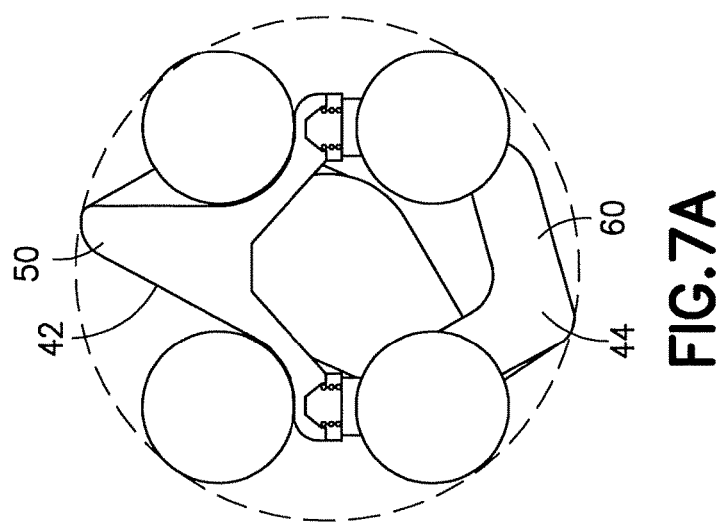

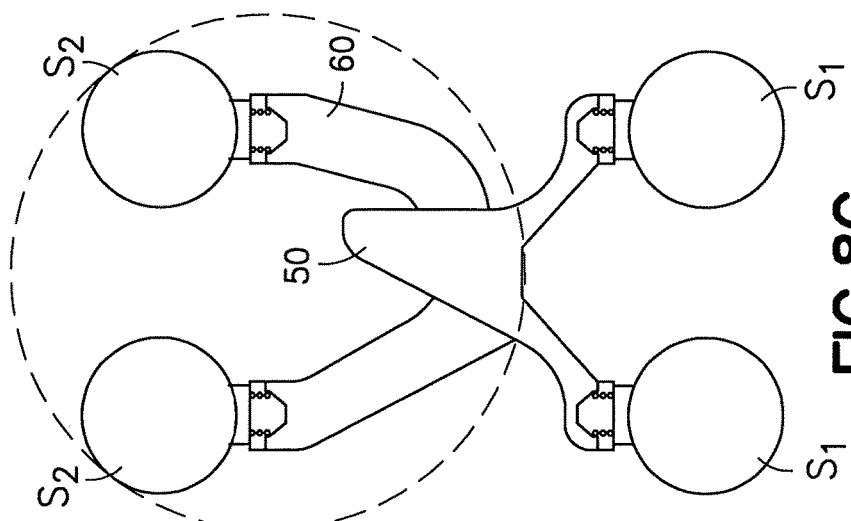
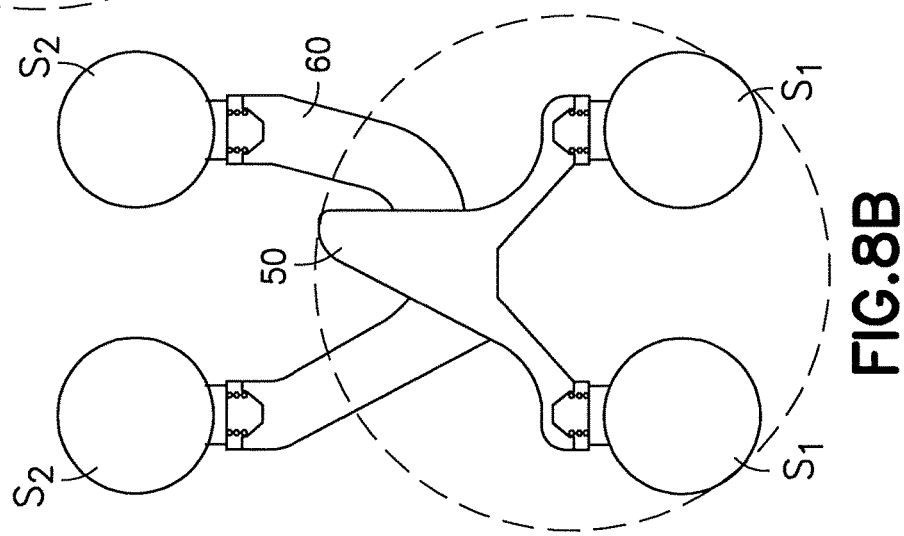
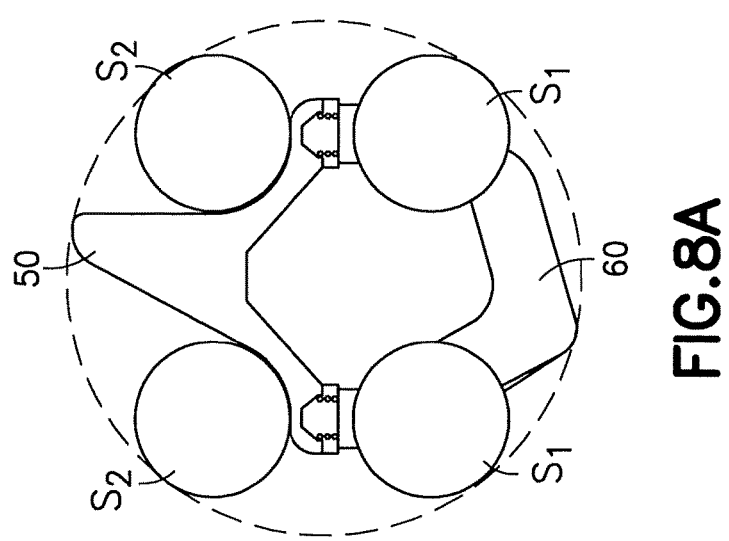

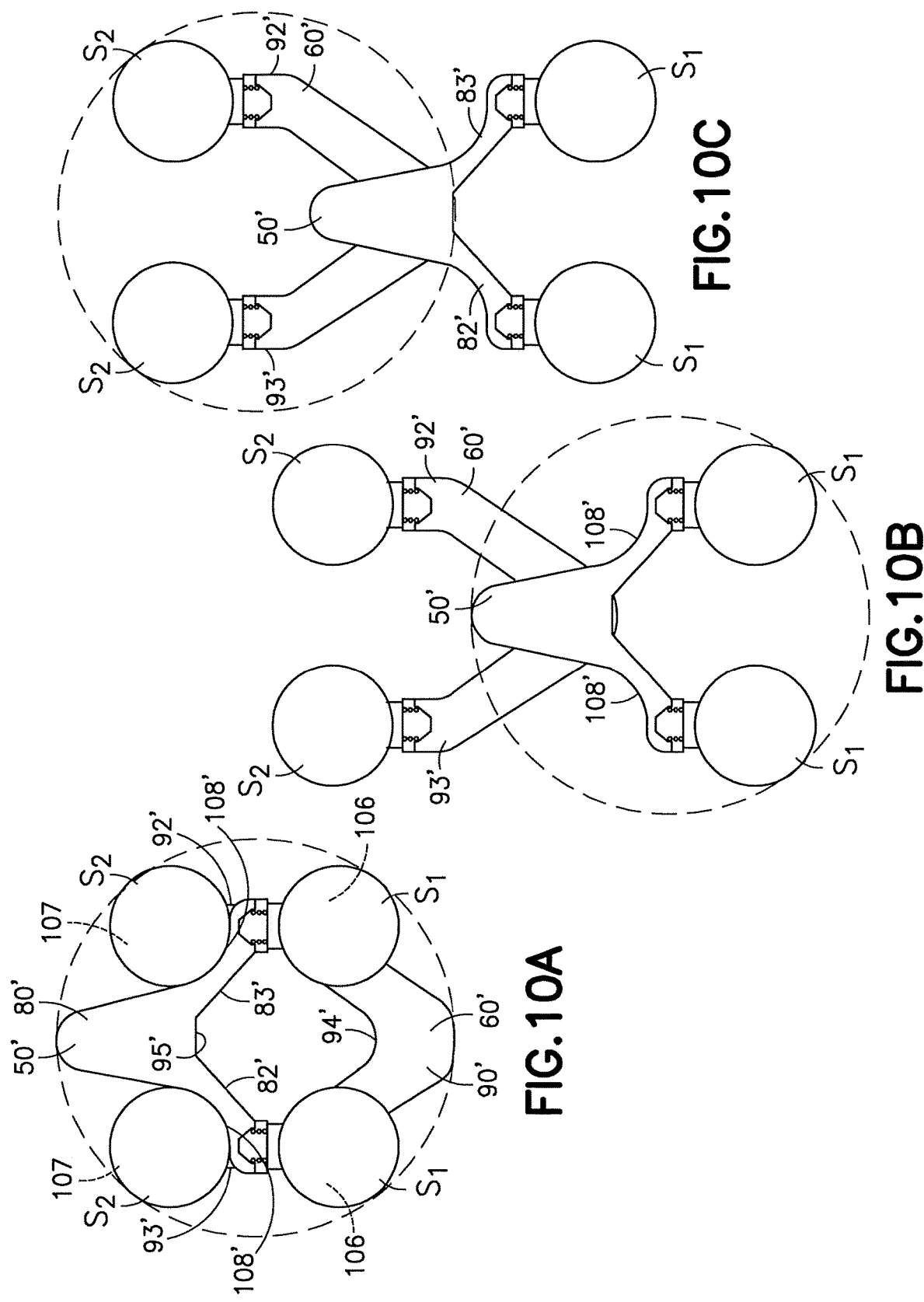

US 12,191,187 B2

DUAL ARM WITH OPPOSED DUAL END EFFECTORS AND NO VERTICAL WAFER OVERLAP

CROSS REFERENCE TO RELATED APPLICATION

This application claims priority under 35 USC 119(e) to U.S. provisional application Ser. No. 62/915,884 filed Oct. 16, 2019, which is hereby incorporated by reference in its entirety.

BACKGROUND

Technical Field

The example and non-limiting embodiments relate generally to a robot and, more particularly, to a robot having multiple arms and multiple end effectors.

SUMMARY

The following summary is merely intended to be exemplary. The summary is not intended to limit the scope of the claims.

In accordance with one aspect, an example apparatus is provided comprising a drive; and a movable arm assembly connected to the drive, where the movable arm assembly comprises a first arm and a second arm, where the first arm comprises a first upper arm, a first forearm and a first end effector, where the second arm comprises a second upper arm, a second forearm and a second end effector, where the first end effector comprises at least two first substrate holding areas, where the second end effector comprises at least two second substrate holding areas, where the drive and the movable arm assembly are configured to prevent the movable arm assembly from passing over top sides of substrates located on the first and second substrate holding areas.

In accordance with another aspect, an example method comprises providing a drive; and connecting a movable arm assembly to the drive, where the movable arm assembly comprises a first arm and a second arm, where the first arm comprises a first upper arm, a first forearm and a first end effector, where the second arm comprises a second upper arm, a second forearm and a second end effector, where the first end effector comprises at least two first substrate holding areas, where the second end effector comprises at least two second substrate holding areas, where the drive and the movable arm assembly are configured to prevent the movable arm assembly from passing over top sides of substrates located on the first and second substrate holding areas.

In accordance with another aspect, an example method comprises locating substrates on substrate holding areas of a first end effector and a second end effector, where the first and second end effectors are part of a movable arm assembly connected to a drive, where the movable arm assembly comprises a first arm and a second arm, where the first arm comprises a first upper arm, a first forearm and the first end effector, where the second arm comprises a second upper arm, a second forearm and the second end effector, where the first end effector comprises at least two first substrate holding areas, where the second end effector comprises at least two second substrate holding areas; and moving the first and second arms to move the substrates on the first and second end effectors from a retracted position to an extended position, where the drive and the movable arm assembly are configured to prevent the movable arm assembly from passing over top sides of the substrates located on the first and second substrate holding areas at all locations of the movable arms including when the end effectors are at their respective retracted positions and respective extended positions.

In accordance with another aspect, an example embodiment is provided with a non-transitory program storage device readable by a machine, tangibly embodying a program of instructions executable by the machine for performing operations, the operations comprising: locating substrates on substrate holding areas of a first end effector and a second end effector, where the first and second end effectors are part of a movable arm assembly connected to a drive, where the movable arm assembly comprises a first arm and a second arm, where the first arm comprises a first upper arm, a first forearm and the first end effector, where the second arm comprises a second upper arm, a second forearm and the second end effector, where the first end effector comprises at least two first substrate holding areas, where the second end effector comprises at least two second substrate holding areas; and controlling the drive to move the first and second arms to move the substrates on the first and second end effectors from a retracted position to an extended position, where the drive is controlled and the movable arm assembly is configured to prevent the movable arm assembly from passing over top sides of the substrates located on the first and second substrate holding areas at all locations of the movable arms including when the end effectors are at their respective retracted positions and respective extended positions.

BRIEF DESCRIPTION OF THE DRAWINGS

The foregoing aspects and other features are explained in the following description, taken in connection with the accompanying drawings, wherein:

FIGS. 5A-5C are schematic top plan views of the upper arms and forearms of the movable arm assembly shown in FIGS. 3-4 at various different positions where there are unequal link lengths;

FIGS. 6A-6C are schematic top plan views of the upper arms and forearms of the movable arm assembly shown in FIGS. 3-4 at various different positions where there are equal link lengths;

FIGS. 7A-7C are schematic top plan views as in FIGS. 5A-5C with unequal link lengths of the assembly as shown in FIGS. 3-4 at different positions;

FIGS. 8A-8C are schematic top plan views as in FIGS. 7A-7C but merely not illustrating the upper arms and forearms for clarity purposes;

FIGS. 10A-10C are schematic top plan views as in FIGS. 9A-9C but merely not illustrating the upper arms and forearms for clarity purposes.

DETAILED DESCRIPTION OF EMBODIMENTS

Figure 1:
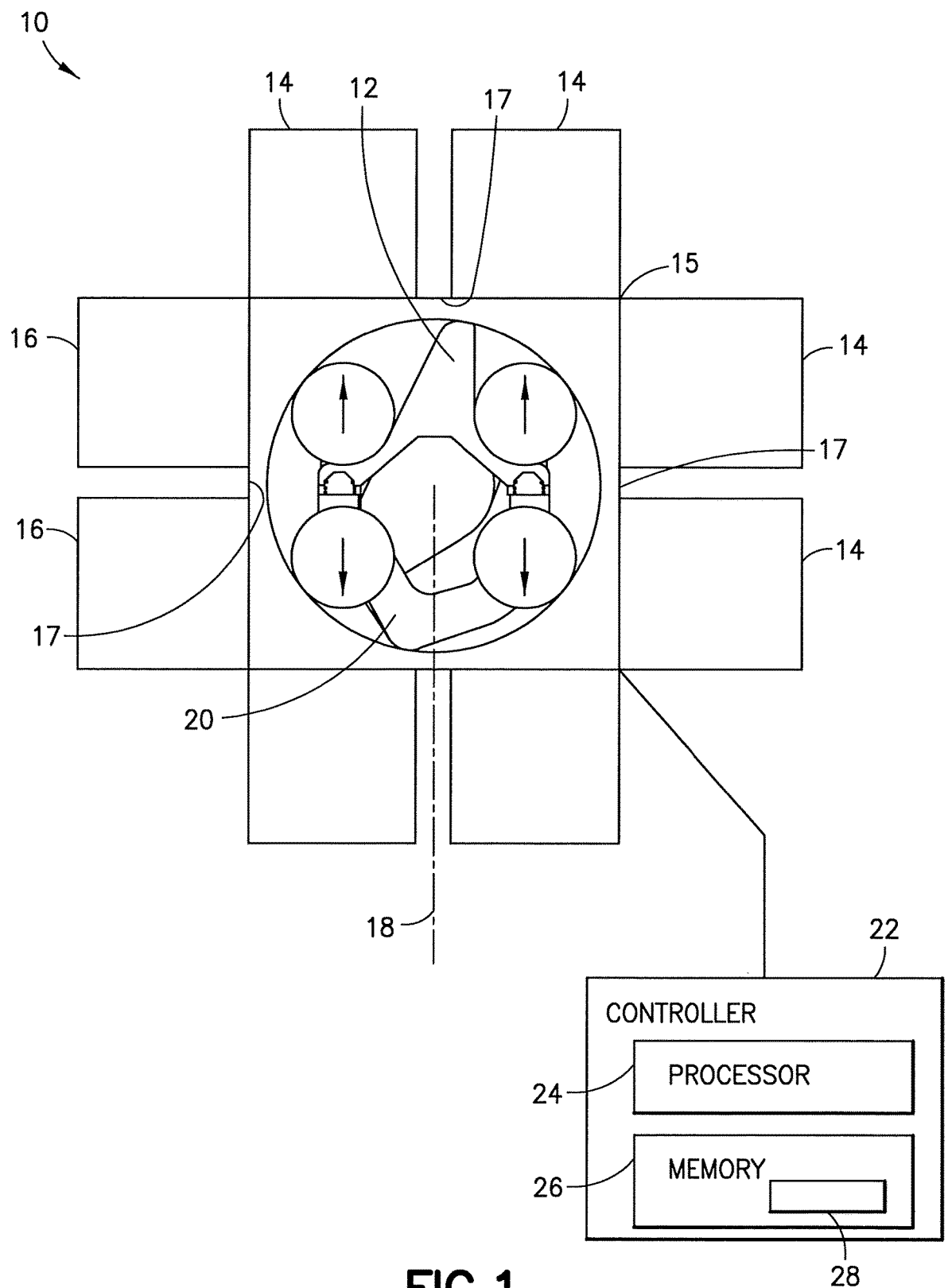
FIG. 1 is a schematic top plan view illustrating features of one example embodiment of a substrate processing apparatus.

Referring to FIG. 1, there is shown a schematic top view of an apparatus 10 incorporating features of an example embodiment. Although the features will be described with reference to the example embodiments shown in the drawings, it should be understood that features can be embodied in many alternate forms of embodiments. In addition, any suitable size, shape or type of elements or materials could be used.

The apparatus 10 in this example is a substrate processing apparatus having a substrate transport apparatus 12. In addition to the substrate transport apparatus 12, the substrate processing apparatus 10 includes multiple substrate processing chambers 14 and substrate cassette elevators or load locks 16 connected to a vacuum chamber 15. The transport apparatus 12 is located, at least partially, in the chamber 15 and is adapted to transport substrates, such as semiconductor wafers or flat panel displays for example, between and/or among the chambers 14 and elevators 16. In alternate embodiments, the transport apparatus 12 could be used in any suitable type of processing apparatus. In this embodiment the transport apparatus 12 comprises a drive 18 and a movable arm assembly 20.

A conventional vacuum environment robotic manipulator typically includes a drive unit which houses all active components of the robotic manipulator, e.g., actuators and sensors, and one or more arms, as discussed above, driven by the drive unit. The arm(s) are typically passive mechanisms, i.e., they do not include any active components, such as actuators and sensors. This is primarily due to difficulties with out-gassing, power distribution and heat removal in vacuum environments.

In a conventional vacuum environment robotic manipulator, since the arm(s) of the robotic manipulators are passive mechanisms, the number of independently driven links is limited to the number of motion axes provided by the drive unit and further constrained by the complexity of transmission of the actuation torques to the individual links of the arm(s). This may limit the arm configurations used in practice to the ones discussed above, which in turn may limit the reach and throughput performance of the existing vacuum environment robotic manipulators.

Furthermore, while atmospheric-environment robots often utilize various substrate grippers, vacuum-compatible robots typically hold the substrate subject to processing solely by means of frictional force between the substrate and the robot end-effector. Since the inertial force at the substrate must not exceed the holding force securing the substrate to the end-effector in order to prevent undesirable slippage, the acceleration of the substrate must be limited accordingly, resulting in limited throughput (number of substrates processed per hour) of the tool. Therefore, there is a need for a gripper, such as an edge-clamping mechanism or an electrostatic hold-down arrangement, that would eliminate the acceleration constraint due to substrate slippage. Furthermore, it is desirable to place sensors on the robot end-effector to assist with substrate alignment, or facilitate station teaching, or similar type operation.

As seen in FIG. 1, the apparatus 10 comprises a controller 22. The controller 22 is configured to control the drive 18 to move the movable arm assembly 20. The controller 22 generally comprises at least one processor 24 and at least one memory 26. Software 28 is stored on the at least one memory 26. The processor 24 is configured to use the software 28 to control various operations of the robot 12, and chambers 14, 16.

Figure 2:
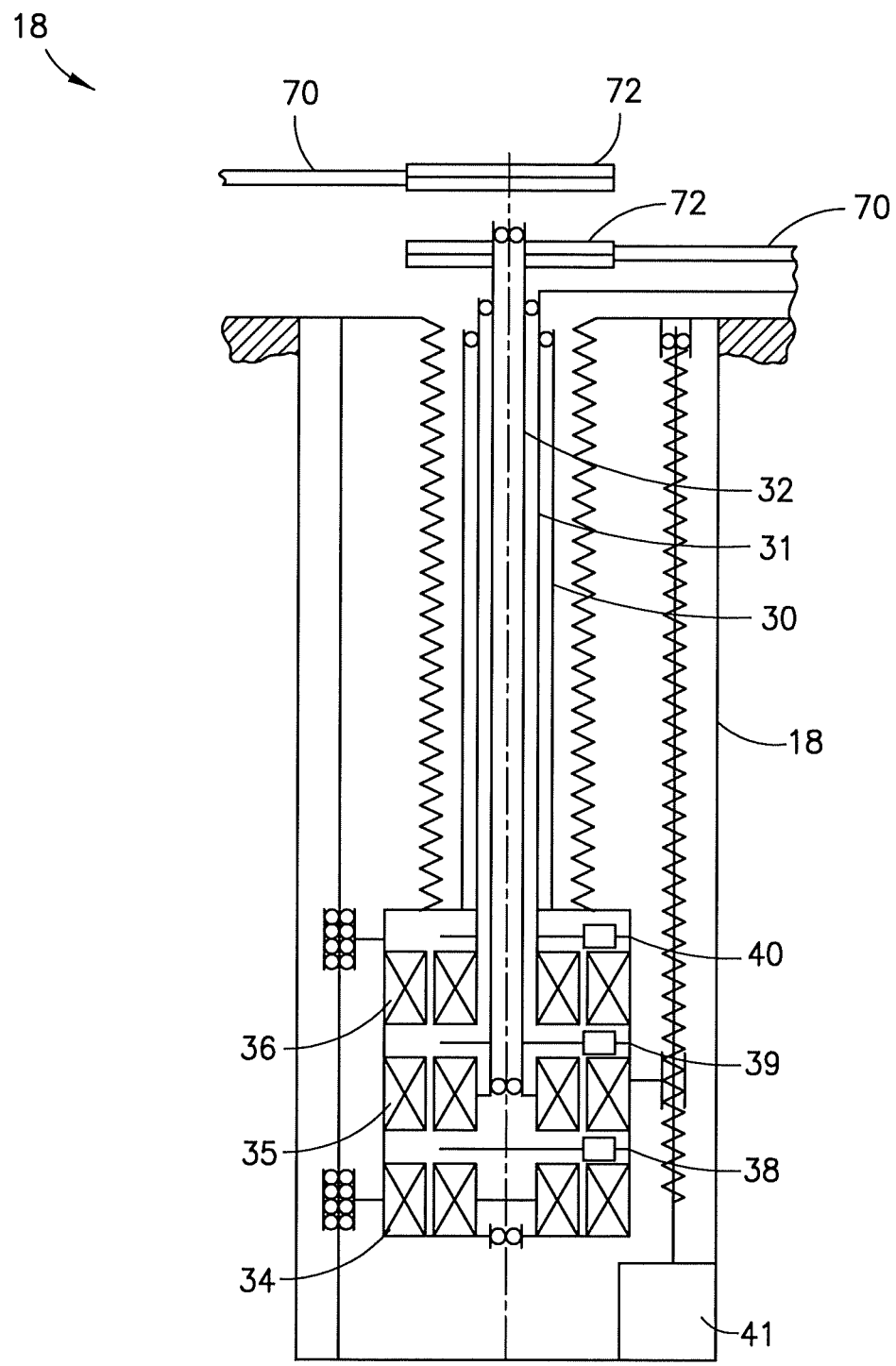
FIG. 2 is a schematic cross sectional view of portion of the drive of the substrate transport apparatus of the substrate processing apparatus shown in FIG. 1.

Referring also to FIG. 2, in this example embodiment the drive 18 comprises three coaxial drive shafts 30, 31, 32. Each drive shaft 30, 31, 32 has a separate drive motor 34, 35, 36 and a separate position sensor 38, 39, 40. The drive 18 also comprises a vertical motor 41 to vertically move the coaxial drive shafts.

Figure 3:
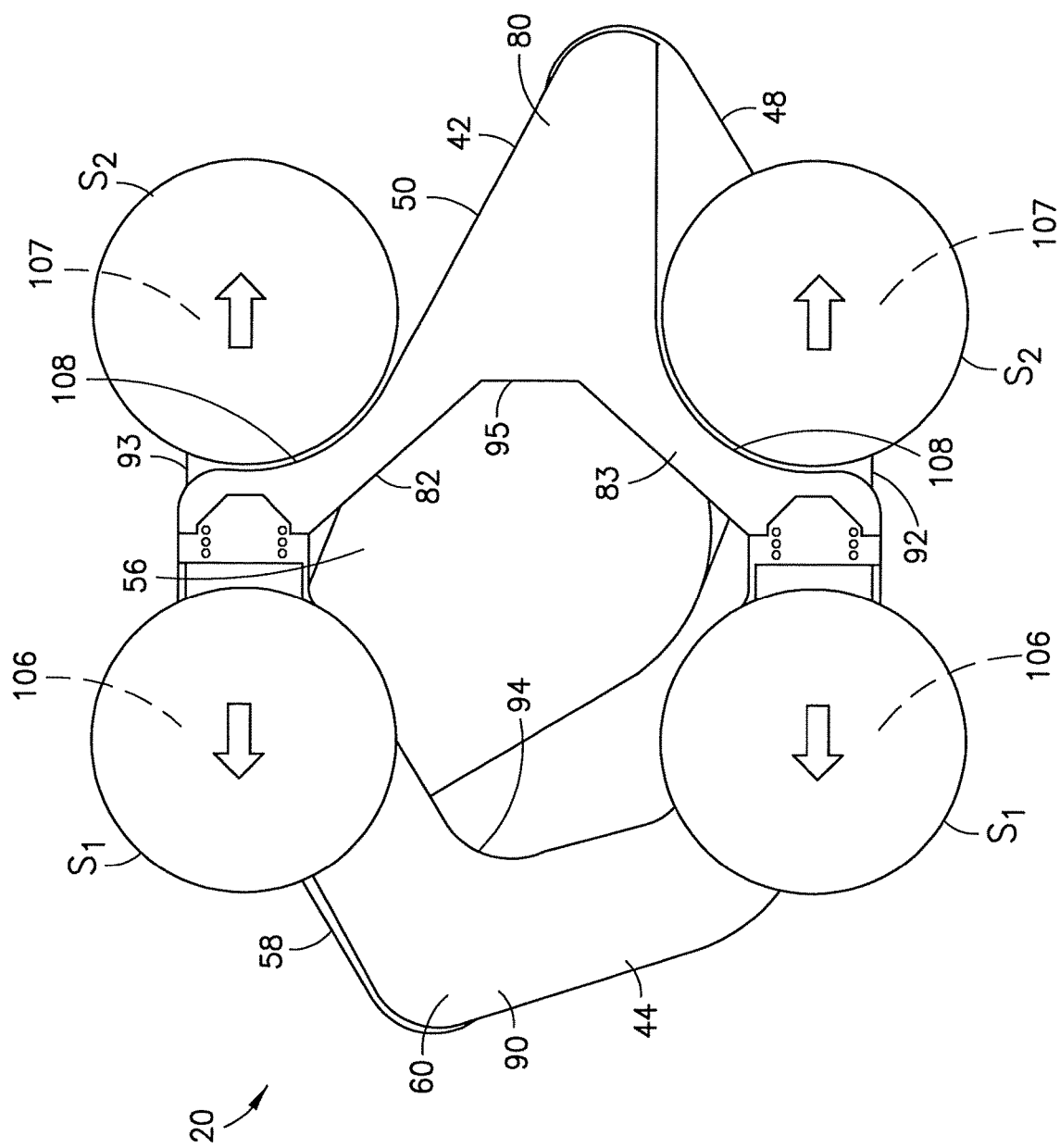
FIG. 3 is a schematic top plan view of the movable arm assembly of the substrate transport apparatus shown in FIGS. 1-2 having substrates thereon.
Figure 4:
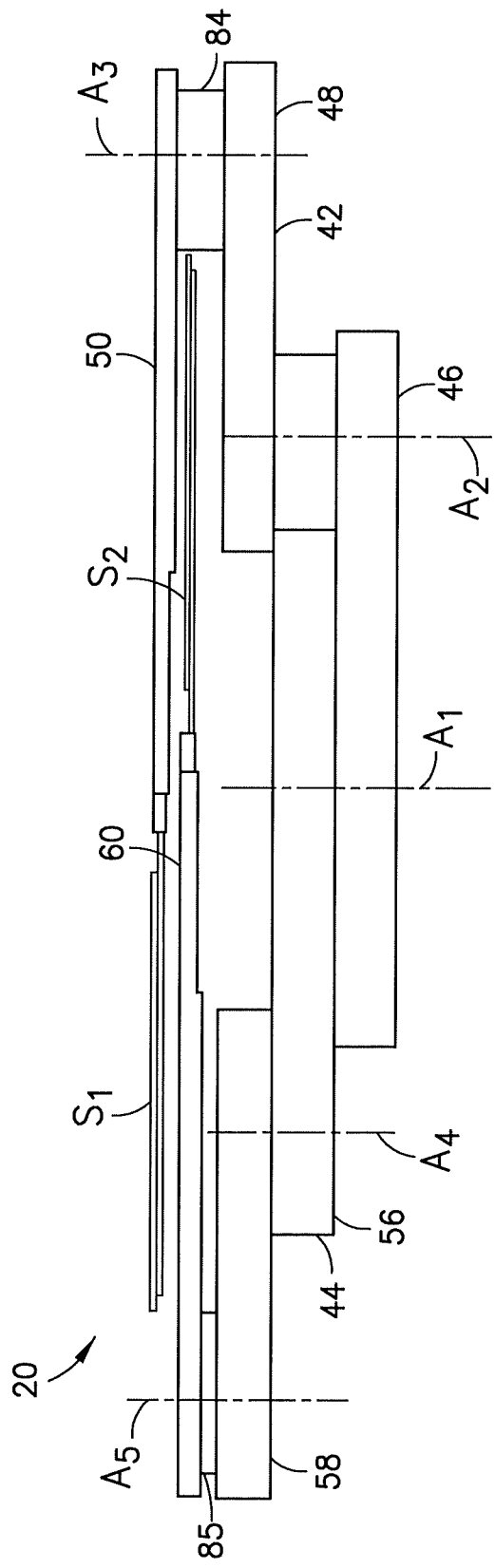
FIG. 4 is a side view of the movable arm assembly shown in FIG. 3.

Referring also to FIGS. 3-4, the movable arm assembly 20 is connected to the top ends of the three coaxial shafts 30, 31, 32. In an alternate example, more than three coaxial drive shafts may be provided. The movable arm assembly 20 generally comprises a first arm 42 connected to the first coaxial shaft 30 and a second arm 44 connected to the second coaxial shaft 31. The first arm 42 generally comprises a first upper arm 46, a first forearm 48, and a first end effector 50. The first end effector 50 is configured to support two substrates $S_1$ thereon. The first upper arm 46 is fixedly mounted to the first coaxial shaft 30 about the coaxial shaft axis A1. The first forearm 48 is rotatably connected to the first upper arm 46 about axis A2. The first end effector is rotatably mounted to the first forearm 48 about axis A3.

The second arm 44 generally comprises a second upper arm 56, a second forearm 58, and a second end effector 60. The second end effector 60 is configured to support two substrates $S_2$ thereon. The second upper arm is fixedly mounted to the second coaxial shaft 32 about the coaxial shaft axis A1. The second forearm 58 is rotatably connected to the second upper arm 56 about axis A4. The second end effector 60 is rotatably mounted to the second forearm 58 about axis A5.

The arms 42, 44 may comprise belts and pulleys 70, 72, some of which are shown in FIG. 2 attached to the third coaxial shaft 32, to rotate the forearms on the upper arms, and rotate the end effectors on the forearms at wrists formed at the axes A3, A5. Other examples of belt and pulley systems are shown in U.S. Pat. No. 9,149,936 B2, which is hereby incorporated by reference in its entirety.

Referring also to FIG. 5A, the upper arms and forearms are shown for an embodiment where there are unequal link lengths. In this example the first upper arm 46 is longer than the first forearm 48, and the second upper arm 56 is longer than the second forearm 58. FIG. 5A shows the extension paths 76, 78 from retract positions for both arms; path 76 for the first arm 42 between the retracted position illustrated by 76A and the extended position illustrated by 76B, and path 78 for the second arm 44 between the retracted position illustrated by 78A and the extended position illustrated by 78B. FIG. 5B shows the arm extend position (56b, 58b) and the arm retract position (56a, 58b) for the upper arm 56 and forearm 58 of the left or second arm 44. In FIG. 5B the upper arm 46 and forearm 48 are illustrated as unmoved from the retracted position. FIG. 5C shows the arm extend position (46b, 48b) and the arm retract position (46a, 48a) for the upper arm 46 and forearm 48 of the right or first arm 42. In FIG. 5C the upper arm 56 and forearm 58 are illustrated as unmoved from the retracted position.

Referring also to FIG. 6A, the upper arms and forearms are shown for an embodiment where there are equal link lengths. In this example the first upper arm 46' is the same length as the first forearm 48', and the second upper arm 56' is the same length as the second forearm 58'. FIG. 6A shows the extension paths 86, 88 from retract positions for both arms; path 86 for the first arm 42' between the retracted position illustrated by 86A and the extended position illustrated by 86B, and path 88 for the second arm 44' between the retracted position illustrated by 88A and the extended position illustrated by 88B. FIG. 6B shows the arm extend position and the arm retract position for the upper arm 56' and forearm 58' of the left or second arm 44'. In FIG. 6B the upper arm 46' and forearm 48' are illustrated as unmoved from the retracted position. FIG. 6C shows the arm extend position and the arm retract position for the upper arm 46' and forearm 48' of the right or first arm 42'. In FIG. 6C the upper arm 56' and forearm 58' are illustrated as unmoved from the retracted position.

Referring also to FIGS. 7A-7B, FIG. 7A shows the unequal link lengths embodiment from FIGS. 5A-5C and the end effectors 50, 60 where both arms 42, 44 are in their retracted positions. FIG. 7B shows the embodiment of FIG. 7A where the second arm 44 (having the lower wrist) is extended, and the first arm 42 is retained at its retracted position. In FIG. 7B, the end effector 60 is, thus, in its extended position. FIG. 7C shows the embodiment of FIG. 7A where the first arm 42 (having the upper wrist) is extended, and the second arm 44 is retained at its retracted position. In FIG. 7C, the end effector 50 is, thus, in its extended position. FIGS. 8A-8C show the same configurations, respectively, but merely showing the first and second end effectors 50, 60 relative to each other for further clarity.

As seen best in FIG. 3, the first end effector 50 comprises a general "Y" shape with a trunk 80 and two arms 82, 83. The trunk 80 is rotatably connected by a pivot 84 (see FIG. 4) at the axis A3 to the first forearm 48. The two arms 82, 83 each have a substrate support area 106 thereon for supporting individual ones of the substrates $S_1$. The two arms 82, 83 also each comprise a recess 108 near the locations of the other substrates $S_2$ to prevent the two arms 82, 83 from being located over the other substrates $S_2$ in the retracted positions shown in FIG. 3. The second end effector 60 comprises a general "C" shape or "V" shape with a center location 90 and two opposite end locations 92, 93. The center location 90 is rotatably connected by a pivot 85 (see FIG. 4) at the axis A5 to the second forearm 58. The opposite end locations 92, 93 each have a substrate support area 107 thereon for supporting individual ones of the substrates $S_2$. The center location 90 forms a recess 94 to prevent the center location 90 from contacting the pivot 84 when the second end effector 60 is in its extended position shown in FIG. 7C.

In this example embodiment the lower dual end effector 60 is configured to transfer two wafers $S_2$ to side-by-side parallel process modules 14 or side-by-side parallel load locks 16. Likewise, the upper dual end effector 50 is configured to transfer two wafers $S_1$ to side-by-side parallel process modules 14 or side-by-side parallel load locks 16. The recess 94 in the second end effector 60 and the recess 95 in the first end effector are sized and shaped to avoid contact with the entrance walls 17 at the modules 14, 16 as the end effectors move the substrates $S_1$, $S_2$ into and out of the modules 14, 16.

Figure 9C:
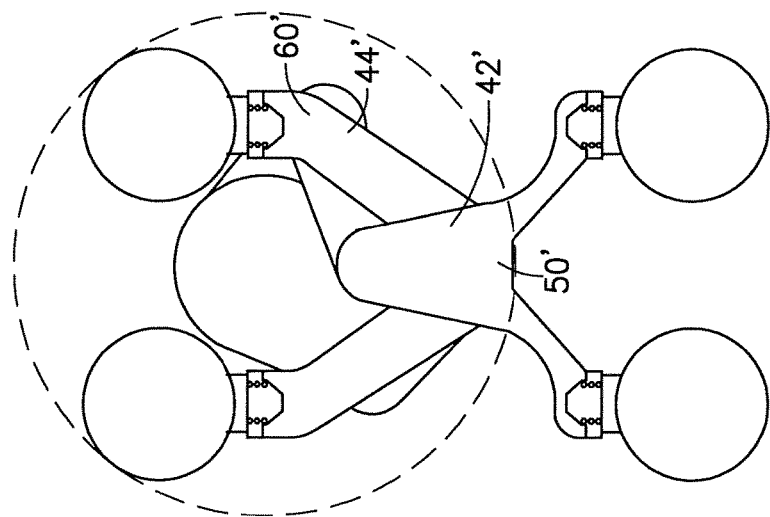
FIGS. 9A-9C are schematic top plan views as in FIGS. 6A-6C with equal link lengths of an alternate embodiment of the dual end effectors shown in FIGS. 3-4 at different positions.
Figure 9B:
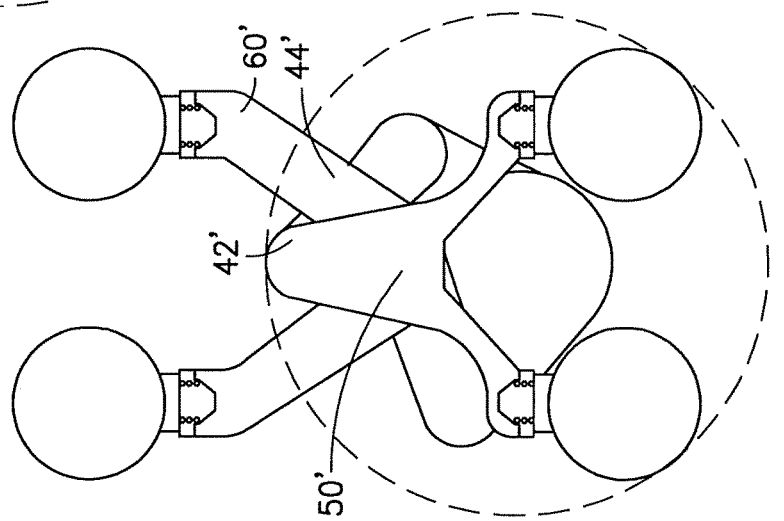
Figure 9A:
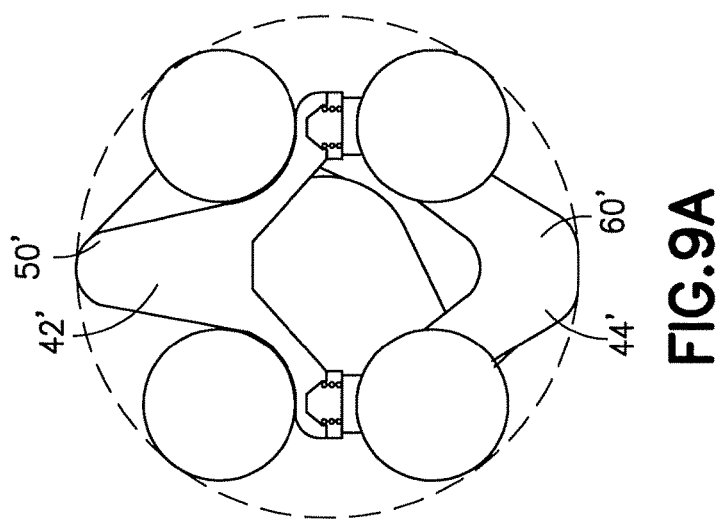

Referring also to FIGS. 9A-9C, FIG. 9A shows the equal link lengths embodiment from FIGS. 6A-6C where both arms 42', 44' are in their retracted positions. FIG. 9B shows the embodiment of FIG. 9A where the second arm 44' (having the lower wrist) is extended, and the first arm 42' is retained at its retracted position. FIG. 9C shows the embodiment of FIG. 9A where the first arm 42' (having the upper wrist) is extended, and the second arm 44' is retained at its retracted position. FIGS. 10A-10C show the same configurations, respectively, but merely showing the first and second end effectors 50', 60' relative to each other for further clarity.

In this example embodiment, the shapes of the end effectors 50', 60' are different from the shapes of the end effector 50, 60. In particular, although all the end effectors are dual-substrate or multi-substrate end effectors (capable of supporting at least two substrates each), the end effectors 50', 60' for the equal length links each have a general symmetrical shape. The end effectors 50, 60 for the unequal length links, on the other hand, each have a general asymmetrical shape. End effector 50' has a general "Y" shape with a trunk 80' and two arms 82', 83'. The trunk 80' is rotatably connected by a pivot 84 (see FIG. 4) at the axis A3 to the first forearm 48'. The two arms 82', 83' each have a substrate support area 106 thereon for supporting individual ones of the substrates $S_1$. The two arms 82', 83' also each comprise a recess 108' near the locations of the other substrates $S_2$ to prevent the two arms 82', 83' from being located over the other substrates $S_2$ in the retracted positions shown in FIG. 10A. The second end effector 60' comprises a general "C" shape or "V" shape with a center location 90' and two opposite end locations 92', 93'. The center location 90' is rotatably connected by a pivot 85 (see FIG. 4) at the axis A5 to the second forearm 58'. The opposite end locations 92', 93' each have a substrate support area 107 thereon for supporting individual ones of the substrates $S_2$. The center location 90' forms a recess 94' to prevent the center location 90' from contacting the pivot 84 when the second end effector 60' is in its extended position shown in FIG. 10C. The recess 94' in the second end effector 60' and the recess 95' in the first end effector 50' are sized and shaped to avoid contact with the entrance walls 17 at the modules 14, 16 as the end effectors move the substrates $S_1$, $S_2$ into and out of the modules 14, 16.

Modern semiconductor process technology is constantly striving to fit more devices in smaller packages. As more complex integrated circuits reduce in size, the importance of controlling surface contamination during process and wafer transport is becoming increasingly important to production yield. One example of surface contamination could be foreign particles falling on the top side of a processed wafer during wafer transport. These particles could bridge the gap between adjacent conductors, create an electrical short in the integrated circuit, and prevent the circuit from functioning properly. Wafer transport automation may be designed to keep all parts, moving or static, from passing over the top of any wafer to minimize or eliminate the possibility of foreign particles transferring from the automation mechanism to the wafers being handled. With features as described herein, a dual robotic arm for transferring wafers to side by side parallel process modules may be provided without any part of the robot arm passing over any of the wafers being handled. Thus, with features as described herein a dual robotic arm with opposing dual end effectors may be provided where no mechanism parts or wafers travel over any wafers being handled by the arm.

In accordance with one example embodiment, an apparatus is provided comprising: a drive; and a movable arm assembly connected to the drive, where the movable arm assembly comprises a first arm and a second arm, where the first arm comprises a first upper arm, a first forearm and a first end effector, where the second arm comprises a second upper arm, a second forearm and a second end effector, where the first end effector comprises at least two first substrate holding areas, where the second end effector comprises at least two second substrate holding areas, where the drive and the movable arm assembly are configured to prevent the movable arm assembly from passing over top sides of substrates located on the first and second substrate holding areas.

The first end effector may comprise a general "Y" shape with the at least two first substrate holding areas at opposite ends of the general "Y" shape. The general "Y" shape of the first end effector may be generally symmetrical. The general "Y" shape of the first end effector may be generally asymmetrical. The general "Y" shape of the first end effector may comprise a trunk and two arms, where each of the arms comprises a recess facing one of the at least two second substrate holding areas, and where the recesses are configured to prevent the two arms from being located over the at least two second substrate holding areas. The second end effector may comprise a general "V" shape with the at least two second substrate holding areas at opposite ends of the general "V" shape. The general "V" shape may comprises a recess configured to prevent a center location of the second end effector from contacting a pivot, connecting the first forearm with the first upper arm, when the second end effector is in an extended position, where the general "V" shape of the second end effector may be generally asymmetrical, where the first end effector comprises a general "Y" shape with the at least two first substrate holding areas at opposite ends of the general "Y" shape, and where the general "Y" shape of the first end effector is generally asymmetrical, where the general "Y" shape of the first end effector may comprise a trunk and two arms, and where each of the arms comprises a recess facing one of the at least two second substrate holding areas, where the recesses are configured to prevent the two arms from being located over the at least two second substrate holding areas.

In accordance with one example method, a method is provided comprising: providing a drive; and connecting a movable arm assembly to the drive, where the movable arm assembly comprises a first arm and a second arm, where the first arm comprises a first upper arm, a first forearm and a first end effector, where the second arm comprises a second upper arm, a second forearm and a second end effector, where the first end effector comprises at least two first substrate holding areas, where the second end effector comprises at least two second substrate holding areas, where the drive and the movable arm assembly are configured to prevent the movable arm assembly from passing over top sides of substrates located on the first and second substrate holding areas.

In accordance with one example method, a method is provided comprising: locating substrates on substrate holding areas of a first end effector and a second end effector, where the first and second end effectors are part of a movable arm assembly connected to a drive, where the movable arm assembly comprises a first arm and a second arm, where the first arm comprises a first upper arm, a first forearm and the first end effector, where the second arm comprises a second upper arm, a second forearm and the second end effector, where the first end effector comprises at least two first substrate holding areas, where the second end effector comprises at least two second substrate holding areas; and moving the first and second arms to move the substrates on the first and second end effectors from a retracted position to an extended position, where the drive and the movable arm assembly are configured to prevent the movable arm assembly from passing over top sides of the substrates located on the first and second substrate holding areas at all locations of the movable arms including when the end effectors are at their respective retracted positions and respective extended positions.

In accordance with one example embodiment, a non-transitory program storage device is provided, such as memory 26 for example, readable by a machine, tangibly embodying a program of instructions executable by the machine for performing operations, the operations comprising: locating substrates on substrate holding areas of a first end effector and a second end effector, where the first and second end effectors are part of a movable arm assembly connected to a drive, where the movable arm assembly comprises a first arm and a second arm, where the first arm comprises a first upper arm, a first forearm and the first end effector, where the second arm comprises a second upper arm, a second forearm and the second end effector, where the first end effector comprises at least two first substrate holding areas, where the second end effector comprises at least two second substrate holding areas; and controlling the drive to move the first and second arms to move the substrates on the first and second end effectors from a retracted position to an extended position, where the drive is controlled and the movable arm assembly is configured to prevent the movable arm assembly from passing over top sides of the substrates located on the first and second substrate holding areas at all locations of the movable arms including when the end effectors are at their respective retracted positions and respective extended positions.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
a drive; and
a movable arm assembly connected to the drive, where the movable arm assembly comprises a first arm and a second arm, where the first arm comprises a first upper arm, a first forearm and a first end effector, where the second arm comprises a second upper arm, a second forearm and a second end effector, where the first end effector comprises at least two first upper substrate holding areas, where the second end effector comprises at least two second lower substrate holding areas, where the drive and the movable arm assembly are configured to prevent the movable arm assembly from passing over top sides of substrates located on the second lower substrate holding areas of the second end effector.

2. The apparatus as in claim 1 where the first end effector comprises a general "Y" shape with the at least two first substrate holding areas at opposite ends of the general "Y" shape.

3. The apparatus as in claim 2 where the general "Y" shape of the first end effector is generally symmetrical.

4. The apparatus as in claim 2 where the general "Y" shape of the first end effector is generally asymmetrical.

5. The apparatus as in claim 2 where the general "Y" shape of the first end effector comprises a trunk and two arms, and where each of the arms comprises a recess facing one of the at least two second substrate holding areas, where the recesses are configured to prevent the two arms from being located over the at least two second substrate holding areas.

6. The apparatus as in claim 2 where the second end effector comprises a general "V" shape with the at least two second substrate holding areas at opposite ends of the general "V" shape.

7. The apparatus as in claim 6 where the general "V" shape comprises a recess configured to prevent a center location of the second end effector from contacting a pivot, connecting the first forearm with the first upper arm, when the second end effector is in an extended position.

8. The apparatus as in claim 6 where the general "V" shape of the second end effector is generally asymmetrical.

9. The apparatus as in claim 8 where the first end effector comprises a general "Y" shape with the at least two first substrate holding areas at opposite ends of the general "Y" shape, and where the general "Y" shape of the first end effector is generally asymmetrical.

10. The apparatus as in claim 8 where the general "Y" shape of the first end effector comprises a trunk and two arms, and where each of the arms comprises a recess facing one of the at least two second substrate holding areas, where the recesses are configured to prevent the two arms from being located over the at least two second substrate holding areas.

11. A method comprising:
providing a drive; and
connecting a movable arm assembly to the drive, where the movable arm assembly comprises a first arm and a second arm, where the first arm comprises a first upper arm, a first forearm and a first end effector, where the second arm comprises a second upper arm, a second forearm and a second end effector, where the first end effector comprises at least two first upper substrate holding areas, where the second end effector comprises at least two second lower substrate holding areas, where the drive and the movable arm assembly are configured to prevent the movable arm assembly from passing over top sides of substrates located on the second lower substrate holding areas of the second end effector.

12. The method of claim 11 where the first end effector comprises a general "Y" shape with the at least two first substrate holding areas at opposite ends of the general "Y" shape.

13. The method of claim 12 where the general "Y" shape of the first end effector is generally asymmetrical.

14. The method of claim 12 where the general "Y" shape of the first end effector is generally symmetrical.

15. The method of claim 12 where the general "Y" shape of the first end effector comprises a trunk and two arms, and where each of the arms comprises a recess facing one of the at least two second substrate holding areas, where the recesses are configured to prevent the two arms from being located over the at least two second substrate holding areas.

16. The method of claim 12 where the second end effector comprises a general "V" shape with the at least two second substrate holding areas at opposite ends of the general "V" shape.

17. The method of claim 16 where the general "V" shape of the second end effector is generally asymmetrical.

18. The method of claim 16 where the general "V" shape comprises a recess configured to prevent a center location of the second end effector from contacting a pivot, connecting the first forearm with the first upper arm, when the second end effector is in an extended position.

19. A method comprising:
locating substrates on substrate holding areas of a first end effector and a second end effector, where the first and second end effectors are part of a movable arm assembly connected to a drive, where the movable arm assembly comprises a first arm and a second arm, where the first arm comprises a first upper arm, a first forearm and the first end effector, where the second arm comprises a second upper arm, a second forearm and the second end effector, where the first end effector comprises at least two first upper substrate holding areas, where the second end effector comprises at least two second lower substrate holding areas; and
moving the first and second arms to move the substrates on the first and second end effectors from a retracted position to an extended position, where the drive and the movable arm assembly are configured to prevent the movable arm assembly from passing over top sides of the substrates located on the second substrate holding areas of the second end effector at all locations of the movable arms including when the end effectors are at their respective retracted positions and respective extended positions.

20. A non-transitory program storage device readable by a machine, tangibly embodying a program of instructions executable by the machine for performing operations, the operations comprising:
locating substrates on substrate holding areas of a first end effector and a second end effector, where the first and second end effectors are part of a movable arm assembly connected to a drive, where the movable arm assembly comprises a first arm and a second arm, where the first arm comprises a first upper arm, a first forearm and the first end effector, where the second arm comprises a second upper arm, a second forearm and the second end effector, where the first end effector comprises at least two first upper substrate holding areas, where the second end effector comprises at least two second lower substrate holding areas; and
controlling the drive to move the first and second arms to move the substrates on the first and second end effectors from a retracted position to an extended position, where the drive is controlled and the movable arm assembly is configured to prevent the movable arm assembly from passing over top sides of the substrates located on the second lower substrate holding areas of the second end effector at all locations of the movable arms including when the end effectors are at their respective retracted positions and respective extended positions.

* * * * *